(12) United States Patent
Yamakawa et al.

(10) Patent No.: US 6,231,974 B1
(45) Date of Patent: May 15, 2001

(54) HOT-MELT ADHESIVE SHEET AND SEMICONDUCTOR DEVICES

(75) Inventors: Kimio Yamakawa; Minoru Isshiki; Yoshiko Otani; Katsutoshi Mine, all of Chiba Prefecture (JP)

(73) Assignee: Dow Corning Toray Silicone Company, Ltd., Tokyo (JP)

( * ) Notice: Subject to any disclaimer, the term of this patent is extended or adjusted under 35 U.S.C. 154(b) by 0 days.

(21) Appl. No.: 09/082,889

(22) Filed: May 21, 1998

(30) Foreign Application Priority Data

May 22, 1997 (JP) .................................................. 9-148642
Jul. 8, 1997 (JP) .................................................. 9-197914

(51) Int. Cl.$^7$ .................................................. B32B 7/12
(52) U.S. Cl. .................................................. 428/354; 428/343
(58) Field of Search .................................................. 428/343, 354

(56) References Cited

U.S. PATENT DOCUMENTS 4,624,724   11/1986   Davis .
5,523,137 * 6/1996 Sei .................................................. 428/354
5,538,771 * 7/1996 Nakayama .................................................. 428/354
5,614,316 * 3/1997 Hashimoto .................................................. 428/354
5,707,730 * 1/1998 Oishi .................................................. 428/354
5,976,698 * 11/1999 Staral .................................................. 428/354

FOREIGN PATENT DOCUMENTS

61/201432   9/1986   (JP) .

* cited by examiner

*Primary Examiner*—Terrel Morris
*Assistant Examiner*—Ula C. Ruddock
(74) *Attorney, Agent, or Firm*—Larry A. Milco

(57) ABSTRACT

To provides a hot-melt adhesive sheet that provides very precise bonding and a stress-relaxation capacity. Also, to provide highly reliable semiconductor devices in which the semiconductor element is bonded to its element attachment site using this hot-melt adhesive sheet.

Hot-melt adhesive sheet that characteristically has hot-melt adhesive on both surfaces of the sheet and spacer within the sheet. Also, semiconductor device characterized in that the semiconductor element therein is bonded to its element attachment site by the above-described hot-melt adhesive sheet.

19 Claims, 5 Drawing Sheets

HOT-MELT ADHESIVE SHEET AND SEMICONDUCTOR DEVICES

FIELD OF THE INVENTION

This invention relates to hot-melt adhesive sheets and semiconductor devices. More particularly, this invention relates to a hot-melt adhesive sheet that provides very precise bonding and exhibits a stress-relaxation capacity. It also relates to highly reliable semiconductor devices in which the semiconductor element therein is bonded to its element attachment site using this hot-melt adhesive sheet.

BACKGROUND OF THE INVENTION

Hot-melt adhesives—which have the capacity to bond various substrates once the adhesive has been softened by heating—also find use as adhesives for bonding semiconductor elements to the corresponding element attachment sites. For example, Japanese Patent Application Laid Open (Kokai or Unexamined) Number Sho 61-201432 (201,432/1986) teaches a method in which a hot-melt adhesive is first coated on an integrated circuit-bearing silicon wafer and the semiconductor elements cut from that wafer are then bonded to their attachment sites.

However, since hot-melt adhesives employ a heat softening regimen, their use to bond a semiconductor element to its attachment site has been associated with the problem of an inability to achieve highly precise bonding due to outflow of the adhesive into the area surrounding the element and variations in the thickness of the adhesive. Moreover, hot-melt adhesives have had a poor stress-relaxation capacity under challenge by thermal shock, which has resulted in a reduced device reliability for semiconductor devices containing a semiconductor element that has been bonded to its attachment site by a hot-melt adhesive.

SUMMARY OF THE INVENTION

The inventors achieved the present invention as a result of extensive research directed to solving the problems described above.

In specific terms, an object of the present invention is to provide a hot-melt adhesive sheet that provides very precise bonding and exhibits a stress-relaxation capacity.

Another object of the present invention is to provide highly reliable semiconductor devices in which the semiconductor element therein is bonded to its element attachment site using this hot-melt adhesive sheet.

The hot-melt adhesive sheet according to the present invention characteristically has hot-melt adhesive on both surfaces of the sheet and has a spacer within the sheet.

Semiconductor devices according to the present invention are characterized in that the semiconductor element therein is bonded to its element attachment site by the hot-melt adhesive sheet described above.

REFERENCE NUMBERS

Figure 1:
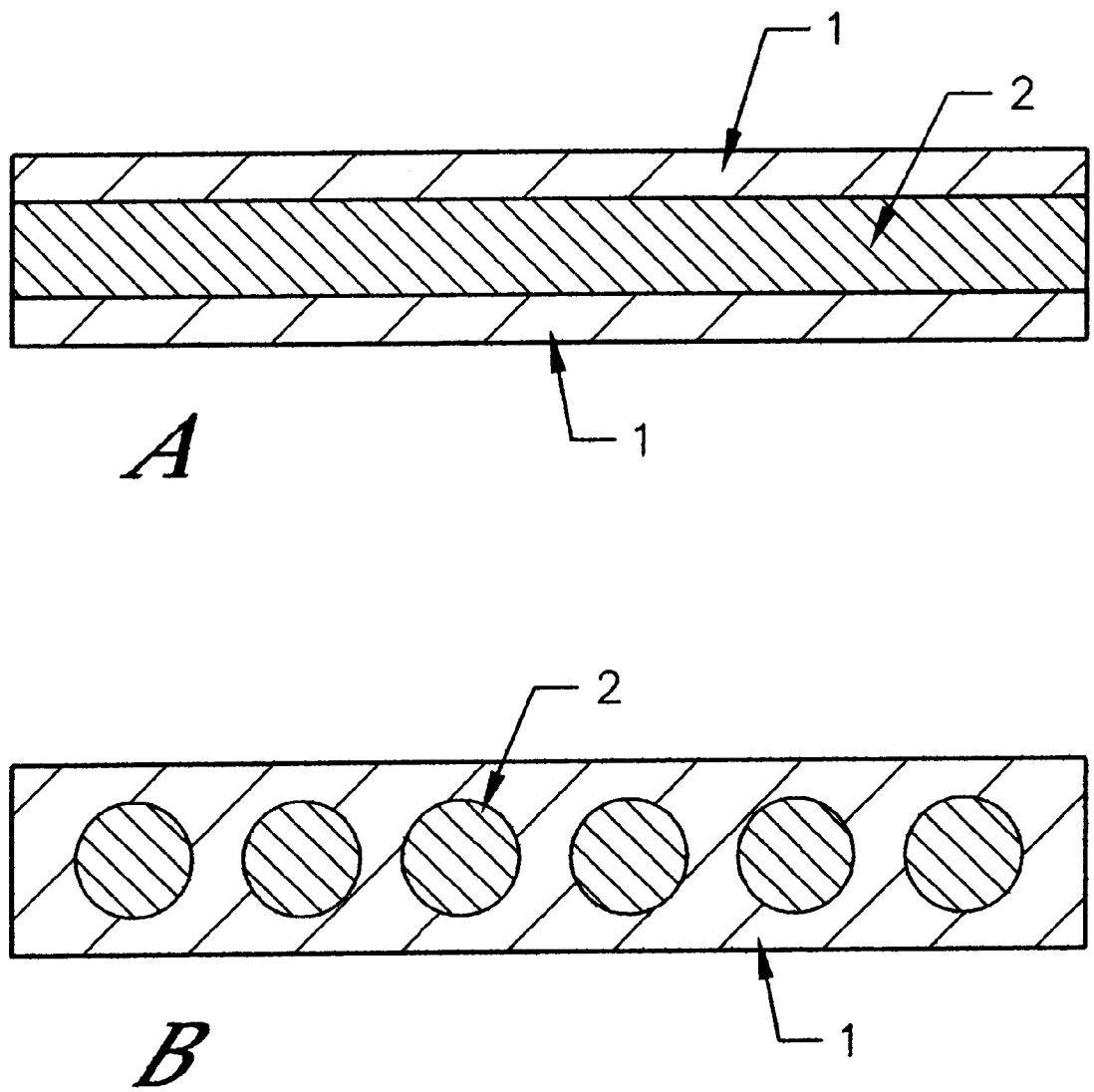
FIG. 1 contains cross sections of hot-melt adhesive sheets according to the present invention. (1) is a cross section of the hot-melt adhesive sheet when the spacer has the form of a sheet. (2) is a cross section of the hot-melt adhesive sheet when the spacer has a particulate form.

I hot-melt adhesive
II spacer
1 semiconductor element
2 hot-melt adhesive sheet
3 glass fiber-reinforced epoxy resin circuit substrate
4 interconnect
5 bonding wire
6 epoxy resin sealant
7 polyimide resin circuit substrate
8 gold bump
9 silicone resin
A, A' glass coupons
B hot-melt adhesive sheet
C hot-melt adhesive sheet after outflow from the pre-heating position
a, b, c, d outflow distances of the hot-melt adhesive sheet from the preheating position

DETAILED DESCRIPTION OF THE INVENTION

The hot-melt adhesive sheet according to the present invention will be explained in detail first.

Hot-melt adhesive sheet according to the present invention characteristically has hot-melt adhesive coated on both sides of the sheet and has a spacer within the sheet. This spacer acts to inhibit outflow of the adhesive from the semiconductor element and maintain the thickness of the adhesive when the hot-melt adhesive sheet according to the present invention is softened by heating. The spacer also improves the stress-relaxation capacity of the adhesive. To fulfill these functions the maximum thickness of the spacer is preferably at least 10% of the thickness of the hot-melt adhesive sheet according to the present invention. When the maximum thickness of the spacer is less than 10% of the thickness of the adhesive, it becomes quite difficult to control the thickness of the adhesive during thermal softening and the bonding precision will decline.

The hot-melt adhesive in the hot-melt adhesive sheet according to the present invention is exemplified by organic rubber adhesives such as butyl rubber adhesives, nitrile rubber adhesives, and so forth; polyolefin adhesives such as ethylene adhesives, polypropylene adhesives, ethylene-propylene copolymer adhesives, isobutylene adhesives, and so forth; epoxy-type adhesives such as epoxy adhesives, silicone-modified epoxy resin adhesives, acrylic-modified epoxy resin adhesives, and so forth; silicone-type adhesives such as silicone adhesives, silicone-modified polyimide adhesives, and so forth; and also polyvinyl acetal adhesives, polyamide adhesives, polyimide adhesives, and polyester adhesives. The silicone adhesives are particularly preferred. This hot-melt adhesive may be a hot-melt adhesive that simply and only softens upon heating or may be a hot-melt adhesive that cures after heat softening. Adhesives that cure after heat softening are preferred because this provides a particularly good reliability on the part of the ultimately obtained semiconductor device formed by bonding a semiconductor element to the element attachment site. The curing reactions in hot-melt adhesives that cure post-heat softening are exemplified by condensation reactions such as alcohol-eliminating condensation reactions, dehydrogenation condensation reactions, dehydration condensation reactions, and so forth; addition reactions such as the hydrosilation reaction, epoxide ring-opening polymerization reactions, and so forth; and radical polymerization reactions as mediated by organic peroxide or ultraviolet radiation.

The spacer in the subject hot-melt adhesive sheet is exemplified by organic and inorganic materials. Organic spacers can improve the flexibility of the hot-melt adhesive sheet and the stress-relaxation performance of the adhesive. The organic material in such a spacer is exemplified by cured organic resins that lack a softening point and by organic resins whose softening point is higher than the softening point of the hot-melt adhesive, vide supra. Applicable organic resins are exemplified by epoxy resins, polyimide resins, polyamide resins, fluororesins, polymethyl methacrylate resins, polycarbonate resins, polyphenylene resins, polysulfide resins, polyester resins, polyetheretherketone resins, and silicone resins. The organic material under consideration is preferably a rubber such as, for example, butyl rubber, EPDM rubber, silicone rubber, or fluororubber, with silicone rubbers being particularly preferred. Spacers composed of inorganic material can lower the thermal expansion coefficient of the hot-melt adhesive sheet and can improve the stress-relaxation performance of the adhesive. Applicable inorganics are exemplified by silica, alumina, glass, quartz, aluminosilicates, titanium oxide, silicon carbide, silicon nitride, boron nitride, silver, copper, stainless steel, and aluminum. Silica and glass are particularly preferred. The subject spacer can take the form, for example, of an essentially flat sheet of uniform thickness, a partially porous sheet, a sheet that presents elevations and depressions on its surface, or a sheet whose thickness at the center exceeds its thickness at the edges, or can take the form of particles with, for example, a spherical, disk-like, or amorphous morphology. The spacer preferably takes the form of a sheet. When, however, the spacer is a particulate, in order to make possible a very precise control of the thickness of the hot-melt adhesive sheet the use is preferred of a particulate spacer in which particles having a particle diameter/average particle diameter ratio of 3 or more make up no more than 1 weight % of the total particles, and the use of a spherical particulate spacer is particularly preferred. FIG. 1 (1) shows a hot-melt adhesive sheet according to the present invention for the case of a sheet-form spacer. FIG. 1 (2) shows a hot-melt adhesive sheet according to the present invention for the case of a particulate spacer.

In the case of a sheet-form spacer, the hot-melt adhesive sheet according to the present invention can be prepared, for example, by coating hot-melt adhesive on the surfaces of the spacer. In the implementation of this method, for example, the surfaces of the spacer can be coated with hot-melt adhesive that has been heat softened or can be coated with hot-melt adhesive diluted with organic solvent followed by removal of the organic solvent. The coating technique in the case of the organic solvent-diluted hot-melt adhesive can be exemplified by spray coating, spin coating, print coating, and brush coating. In the case of a particulate spacer, the hot-melt adhesive sheet according to the present invention can be prepared, for example, by mixing the spacer with the hot-melt adhesive and then forming this mixture into a sheet. This method can be implemented, for example, by mixing the heat-softened hot-melt adhesive with the spacer and then forming this mixture into the sheet, or by mixing the spacer with organic solvent-diluted hot-melt adhesive, forming this mixture into a sheet, and subsequently removing the organic solvent.

Hot-melt adhesive according to the present invention takes the form of a sheet, but in more specific terms it may take the form, for example, of a uniformly thick sheet, a sheet that presents elevations and depressions on its surface, or a sheet whose thickness at its center is greater than its thickness at its edges. Sheet whose central thickness is greater than its edge thickness is particularly preferred when the subject adhesive will be heat softened and bonded to substrates with large bonding areas because this sheet configuration inhibits the trapping of air bubbles at the corresponding interfaces.

Semiconductor devices according to the present invention will now be considered in detail.

Semiconductor devices according to the present invention are characterized in that the semiconductor element therein is bonded to its attachment site by the hot-melt adhesive sheet described hereinabove. These semiconductor devices employ the hot-melt adhesive sheet according to the present invention as described above. Applicable semiconductor devices can be exemplified by diodes, transistors, thyristors, monolithic integrated circuits, hybrid integrated circuits, large-scale integrated circuits, and very large-scale integrated circuits. The semiconductor elements in these semiconductor devices can be exemplified by diodes, transistors, thyristors, and monolithic integrated circuits, and by circuit substrate elements that are mounted with semiconductor chips such as hybrid integrated circuits, large-scale integrated circuits, and very large-scale integrated circuits. The semiconductor element attachment sites can be exemplified by circuit substrates, chip carriers, and tabs.

Figure 2:
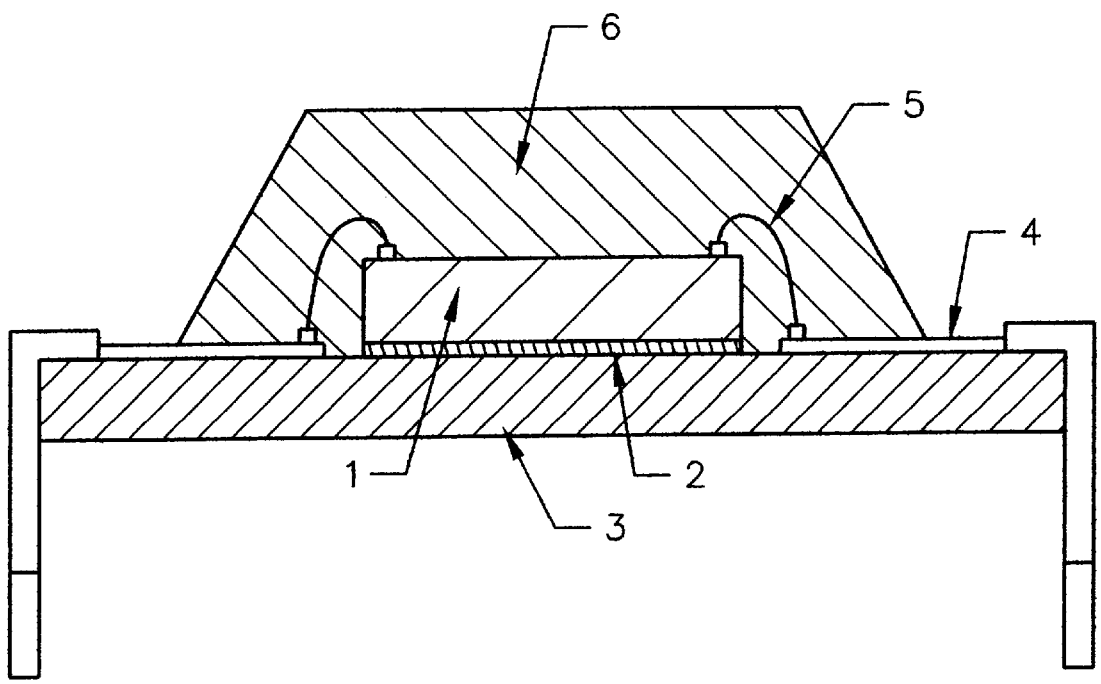
FIG. 2 contains a cross section of a hybrid integrated circuit provided as one example of semiconductor devices according to the present invention.
Figure 3:
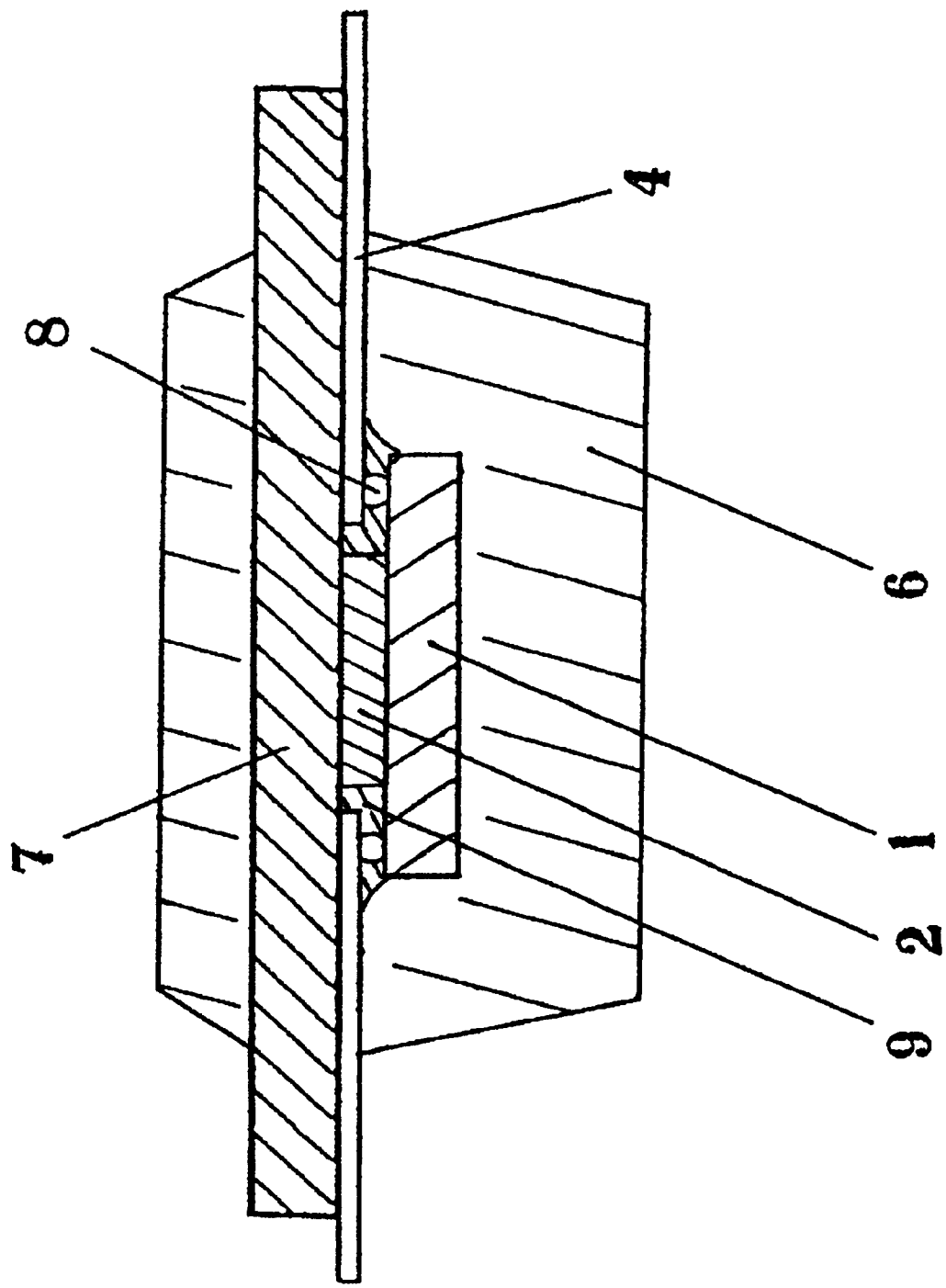
FIG. 3 contains a cross section of an LSI provided as one example of semiconductor devices according to the present invention.
Figure 4:
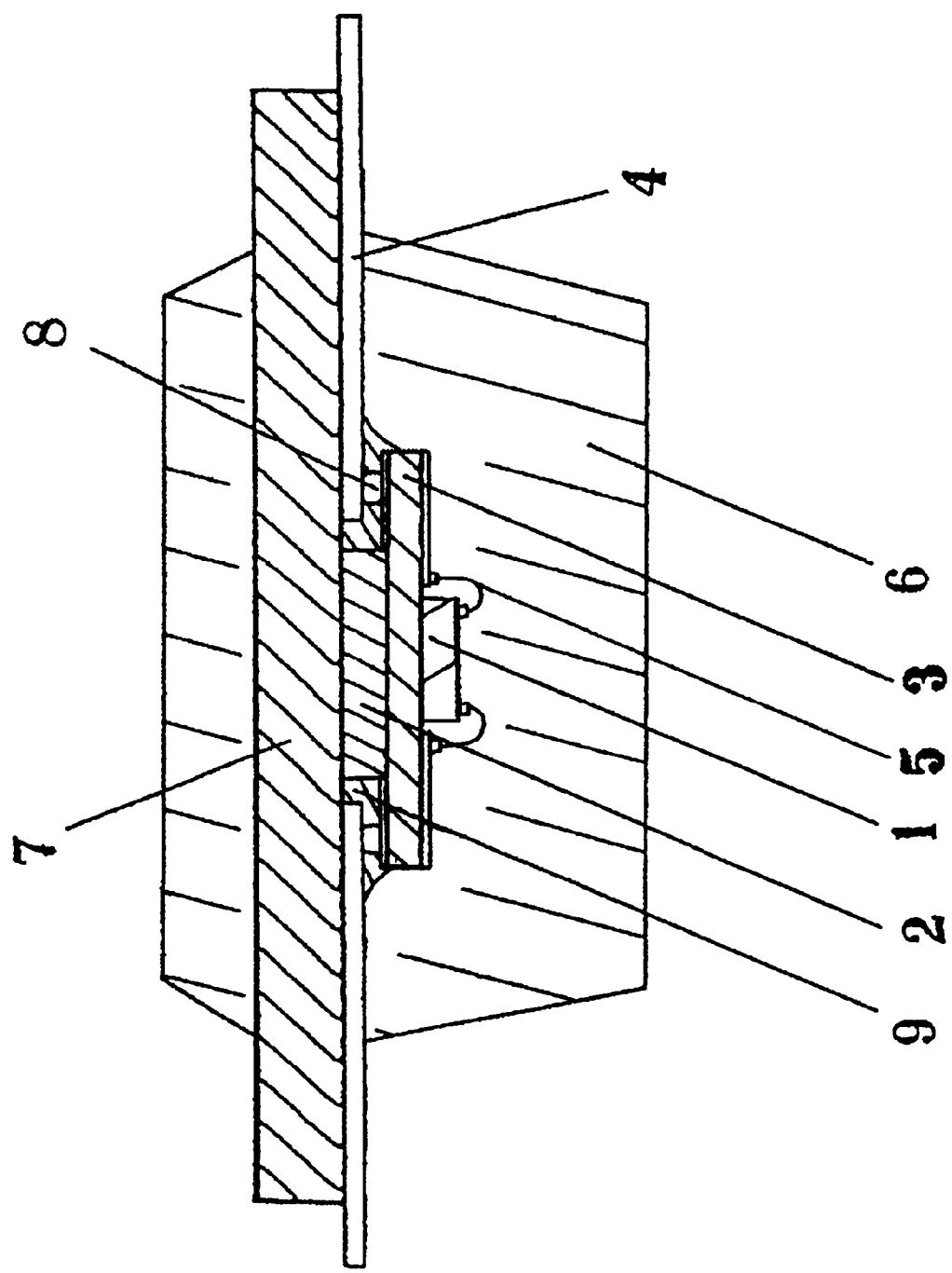
FIG. 4 contains a cross section of an LSI module provided as one example of semiconductor devices according to the present invention.

Examples of semiconductor devices according to the present invention are provided in FIG. 2 (cross section of a hybrid integrated circuit), FIG. 3 (cross section of a large-scale integrated circuit), and FIG. 4 (cross section of a large-scale integrated circuit module) in support of a more detailed explanation of semiconductor devices according to the present invention. The explanation will continue with reference to these figures. In the semiconductor device shown in FIG. 2, a semiconductor element 1 has been bonded to a circuit substrate 3 using the hot-melt adhesive sheet 2, and the interconnects 4, which are connected to the outer leads, are electrically connected to the semiconductor element 1 by the bonding wires 5. The circuit substrate 3 can be formed from, for example, ceramic, glass, epoxy resin, polyimide resin, phenolic resin, bakelite resin, melamine resin, glass fiber-reinforced epoxy resin, and so forth. The interconnects 4 can be made of gold, copper, aluminum, silver-palladium, or indium-tin oxide (ITO). The bonding wires 5 can be made of gold, copper, or aluminum. The semiconductor element 1 may also be sealed with a sealant resin 6. The resin making up the sealant resin 6 can be exemplified by epoxy resin, phenolic resin, and polyphenylene sulfide resin. In addition to the semiconductor element 1, other electronic components, e.g., resistors, capacitors, coils, etc., can be mounted on the circuit substrate 3.

In the semiconductor device depicted in FIG. 3, a semiconductor element 1 is bonded to a circuit substrate 7 by the hot-melt adhesive sheet 2, and in this case the semiconductor element 1 and the interconnects 4 on the circuit substrate 7 (chip carrier) are electrically connected by the bumps 8 (leads). The circuit substrate 7 can be made, for example, of polyimide resin, ceramic, or glass fiber-reinforced epoxy resin. The interconnects 4 can be exemplified by the same materials as described above. The bumps 8 can be, for example, gold, aluminum, or solder. The region around the bumps 8 between the semiconductor element 1 and the circuit substrate 7 can be filled by a resin 9. The resin forming this resin 9 can be, for example, a liquid curable silicone composition or a liquid curable epoxy resin composition. The semiconductor element 1 can also be sealed with a resin sealant 6 on an optional basis. The resin that will form this resin sealant 6 can be exemplified by the resins listed above.

In the semiconductor device illustrated in FIG. 4, a circuit substrate element, commonly called a chip carrier, is bonded to the circuit substrate 7 by the hot-melt adhesive sheet 2. The circuit substrate element carries a semiconductor element 1 that is electrically bonded by the bonding wires 5 to the interconnects on the circuit substrate 3. The interconnects 4 on the circuit substrate 7 and the interconnects on the circuit substrate 3 are electrically connected by the bumps 8. The material of the circuit substrate 3 is exemplified by the same materials as listed above for the circuit substrates; the material of the bonding wires 5 is exemplified by the same materials as listed above for bonding wires; the material of the circuit substrate 7 is exemplified by the same materials as listed above for the circuit substrates; and the material of the bumps 8 is exemplified by the same materials as listed above for the bumps. The periphery around the bumps 8 between the circuit substrate 3 and the circuit substrate 7 may be filled with a resin 9, and the semiconductor element 1 may be sealed by a resin sealant 6. The resin forming this resin 9 is exemplified by the same resins as listed above, and the resin forming resin sealant 6 is exemplified by the same resins as listed above.

Methods for fabricating semiconductor devices according to the present invention will be explained with reference to the drawings. The semiconductor device illustrated in FIG. 2 can be fabricated, for example, as follows: the hot-melt adhesive sheet 2 may first be affixed to the semiconductor element 1 and the circuit substrate 3 may then be affixed to this adhesive 2; or the adhesive 2 may first be affixed to the circuit substrate 3 and the semiconductor element 1 may then be affixed to this adhesive 2; and the adhesive 2 is subsequently heat softened in either case. The adhesive 2 may be heat softened using means such as, for example, a hot plate, hot air current, infrared irradiation, high-frequency waves, ultrasound, and so forth. In this operation pressure is preferably applied to the adhesive 2 during its heating episode. After this, the semiconductor element 1 and the interconnects 4 are electrically connected by the bonding wires 5. The semiconductor element 1 is then sealed with the resin sealant 6 as necessary.

The semiconductor device illustrated in FIG. 3 can be fabricated, for example, as follows: the hot-melt adhesive sheet 2 may first be affixed to the semiconductor element 1 and the circuit substrate 7 may then be affixed to this adhesive 2; or the adhesive 2 may first be affixed to the circuit substrate 7 and the semiconductor element 1 may then be affixed to this adhesive 2; and the adhesive 2 is subsequently heat softened in either case. The procedure used to heat soften the adhesive 2 is exemplified by the same heat softening procedures as listed above. The semiconductor element 1 and the interconnects 4 are subsequently electrically connected by melt-bonding with the bumps 8. The space around the bumps 8 may be filled with the resin 9 as necessary, and the semiconductor element 1 may also be sealed with the resin sealant 6 as necessary.

The semiconductor device illustrated in FIG. 4 can be fabricated, for example, as follows: the hot-melt adhesive sheet 2 may first be affixed to the chip carrier on which the semiconductor element 1 and the interconnects on the circuit substrate 3 are electrically connected by bonding wires 5, and the circuit substrate 7 may then be affixed to this adhesive 2; or the adhesive 2 may first be affixed to the circuit substrate 7 and the aforementioned circuit substrate 3 may then be affixed to the adhesive 2; and the adhesive 2 is subsequently heat softened in either case. The procedure used to heat soften the adhesive 2 is exemplified by the same heat softening procedures as listed above. After this, the circuit substrate 3 and the circuit substrate 7 are electrically connected by melt-bonding with the bumps 8. The space around the bumps 8 may then be filled with the resin 9 as necessary, and the semiconductor element 1 may also be sealed with the resin sealant 6 as necessary.

EXAMPLES

The hot-melt adhesive sheet according to the present invention and semiconductor devices according to the present invention are explained in greater detail below through working examples. The degree of outflow of the hot-melt adhesive sheet during its heat softening and semiconductor device reliability were evaluated as follows.

Evaluation of Outflow of the Hot-melt Adhesive Sheet During its Heat Softening

Figure 5:
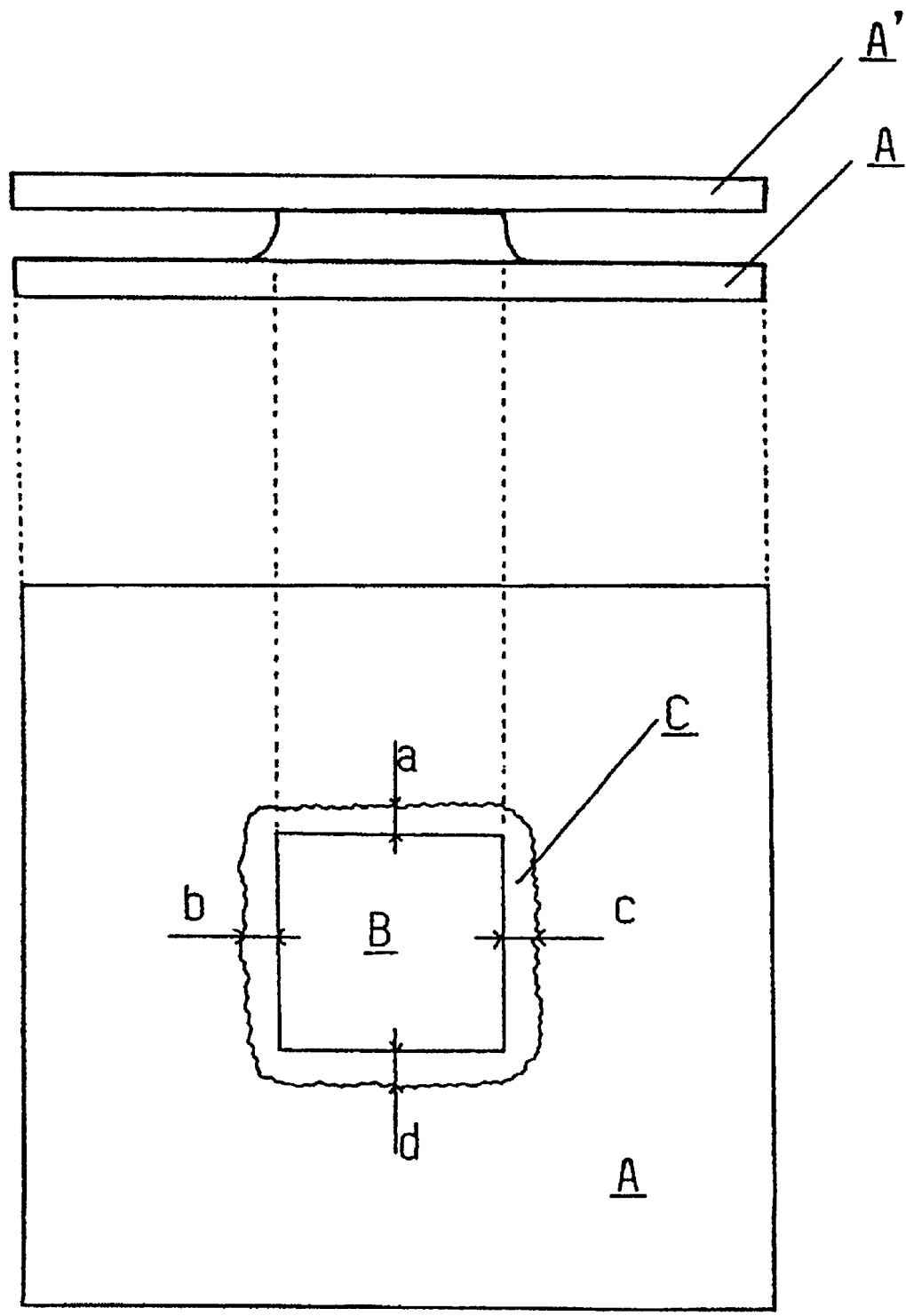
FIG. 5 contains top and side views of the specimen used in the examples according to the present invention to evaluate the presence/absence of adhesive outflow when the hot-melt adhesive sheet was heat softened.

The degree of outflow of the hot-melt adhesive sheet during heat softening was evaluated using specimens as illustrated in FIG. 5. The hot-melt adhesive sheet was affixed to glass coupon A (5 cm×5 cm) to provide a 1 cm×1 cm×1 mm profile. After also affixing a similar glass coupon A' on top of the adhesive, the assembly was heated for 2 hours at 150° C. in a forced convection oven. Five of these glass coupon-bonded specimens were prepared. The average {(a+b+c+d)/4} of the distances of the outflowed adhesive C from the pre-heating position for the adhesive B between the glass coupons A–A' was obtained. The reported value is the average value for the 5 specimens.

Method 1 for Evaluating Semiconductor Device Reliability

The reliability evaluation was carried out in this method by fabricating semiconductor devices as illustrated in FIG. 2.

Semiconductor devices as illustrated in FIG. 2 were fabricated as follows. The hot-melt adhesive sheet 2 (8 mm×8 mm) was affixed to a glass fiber-reinforced epoxy resin circuit substrate 3 having outer leads at its edges and interconnects 4 imprinted on its surface. The semiconductor element 1 was then affixed to this adhesive 2 and bonded to circuit substrate 3 by heating for 2 hours at 150° C. in a forced convection oven. The semiconductor element 1 and the interconnects 4 were subsequently electrically connected by the bonding wires 5. This was followed by sealing the semiconductor element 1 with an epoxy resin sealant. The epoxy resin sealant was cured by first heating for 1 hour at 80° C. in a forced convection oven and then for 2 hours at 150° C. in a forced convection oven. Twenty semiconductor devices were fabricated by this procedure.

These semiconductor devices were subjected to 100 or 500 cycles of thermal cycle testing in which 1 cycle consisted of standing at −30° C. for 30 minutes and at +120° C. for 30 minutes. Electrical continuity testing was then performed across the outer leads and the number of semiconductor devices suffering continuity failure (defect rate) was determined.

Method 2 for Evaluating Semiconductor Device Reliability

The reliability evaluation was carried out in this method by fabricating semiconductor devices as illustrated in FIG. 3.

Semiconductor devices as illustrated in FIG. 3 were fabricated as follows. The hot-melt adhesive sheet 2 (8 mm×8 mm) was first affixed to a circuit substrate 7; the semiconductor element 1 was then affixed to this adhesive 2; and the semiconductor element 1 was bonded to the circuit substrate 7 by heating for 2 hours at 150° C. in a forced convection oven. The interconnects 4 on the circuit substrate 7 and the semiconductor element 1 were electrically connected by the gold bumps 8 and the space around the bumps 8 was filled with a silicone resin 9. This silicone resin was produced by infilling with a liquid curable silicone composition and curing by heating for 1 hour at 150° C. in a forced convection oven. The semiconductor element 1 was then sealed with an epoxy resin sealant 6. This epoxy resin sealant was cured by first heating for 1 hour at 80° C. in a forced convection oven and then for 2 hours at 150° C. in a forced convection oven. Twenty semiconductor devices were fabricated by this procedure.

These semiconductor devices were subjected to 100 or 500 cycles of thermal cycle testing in which 1 cycle consisted of standing at −30° C. for 30 minutes and at +120° C. for 30 minutes. Electrical continuity testing was then performed across the outer leads and the number of semiconductor devices suffering continuity failure (defect rate) was determined.

Method 3 for Evaluating Semiconductor Device Reliability

The reliability evaluation was carried out in this method by fabricating semiconductor devices as illustrated in FIG. 4.

Semiconductor devices as illustrated in FIG. 4 were fabricated as follows. The chip carrier—carrying semiconductor element 1 electrically connected by bonding wires 5 to the interconnects on circuit substrate 3—was first affixed to a hot-melt adhesive sheet 2 (22 mm×22 mm) that had already been affixed to the circuit substrate 7. The circuit substrate 3 and the circuit substrate 7 were then bonded by heating for 2 hours at 150° C. in a forced convection oven. The interconnects on the circuit substrate 3 and the interconnects 4 on the circuit substrate 7 were electrically connected by the gold bumps 8 and the space around the bumps 8 was filled with a silicone resin 9. This silicone resin was produced by infilling with a liquid curable silicone composition and curing by heating for 1 hour at 150° C. in a forced convection oven. The semiconductor element 1 was then sealed with an epoxy resin sealant 6. This epoxy resin sealant was cured by first heating for 1 hour at 80° C. in a forced convection oven and then for 2 hours at 150° C. in a forced convection oven. Twenty semiconductor devices were fabricated by this procedure.

These semiconductor devices were subjected to 100 or 500 cycles of thermal cycle testing in which 1 cycle consisted of standing at −30° C. for 30 minutes and at +120° C. for 30 minutes. Electrical continuity testing was then performed across the outer leads and the number of semiconductor devices suffering continuity failure (defect rate) was determined.

Example 1

An essentially flat silicone rubber sheet with a JIS A durometer of 30 and a thickness of 200 $\mu$m was employed as the spacer. Both sides of this silicone rubber sheet were coated to an average thickness of 50 $\mu$m with a silicone hot-melt adhesive (THMX-101 from the Dow Corning Toray Silicone Company, Limited, JIS A durometer of its cured silicone product >98) that had a softening temperature of 80° C. and that cured by the hydrosilation reaction upon heating. Coating was carried out by preliminarily dissolving the hot-melt adhesive in toluene and spray coating this solution. The toluene was air-dried off at room temperature to produce an essentially flat hot-melt adhesive sheet with a thickness of 300 $\mu$m. The outflow of the hot-melt adhesive sheet during heat softening and the semiconductor device reliability were evaluated, and the results are reported in Table 1.

Example 2

A hot-melt adhesive sheet was prepared as in Example 1, but in this case the silicone rubber sheet used as the spacer had a size of 22 mm×22 mm with a central thickness of 220 $\mu$m and an edge thickness of 180 $\mu$m. The resulting hot-melt adhesive sheet had a central thickness of 320 $\mu$m an edge thickness of 280 $\mu$m. As in Example 1, the outflow of the hot-melt adhesive sheet during heat softening and the semiconductor device reliability were evaluated. The results are reported in Table 1.

Comparative Example 1

An essentially flat hot-melt adhesive sheet with a thickness of 300 $\mu$m was produced as in Example 1, but without using the silicone rubber spacer. As in Example 1, the outflow of the hot-melt adhesive sheet during heat softening and the semiconductor device reliability were evaluated. The results are reported in Table 1.

Comparative Example 2

Proceeding as in Example 2, a hot-melt adhesive sheet was produced that had a size of 22 mm×22 mm, a central thickness of 320 $\mu$m, and an edge thickness of 280 $\mu$m, but in this case without the use of the spacer. As in Example 1, the outflow of the hot-melt adhesive sheet during heat softening and the semiconductor device reliability were evaluated. The results are reported in Table 1.

Example 3

The following were mixed in toluene solution: spacer in the form of 60 weight parts silicone rubber particles with a JIS A durometer of 50, an average particle diameter of 100 $\mu$m, and a maximum particle diameter of 280 $\mu$m, and 100 weight parts silicone hot-melt adhesive (THMX-101 from the Dow Corning Toray Silicone Company, Limited, JIS A durometer of its cured silicone product >98) that had a softening temperature of 80° C. and that cured by the hydrosilation reaction upon heating. The toluene was removed by air drying at room temperature to produce an essentially flat hot-melt adhesive sheet with a thickness of 300 $\mu$m. As in Example 1, the outflow of the hot-melt adhesive sheet during heat softening and the semiconductor device reliability were evaluated. The results are reported in Table 1.

Example 4

A hot-melt adhesive sheet was produced as in Example 3, but in this case using as the spacer silica powder with an average particle diameter of 100 $\mu$m and a maximum particle diameter of 250 $\mu$um. The resulting essentially flat hot-melt adhesive sheet had a thickness of 300 $\mu$m. As in Example 1, the outflow of the hot-melt adhesive sheet during heat softening and the semiconductor device reliability were evaluated. The results are reported in Table 1.

Example 5

An essentially flat silicone rubber sheet with a JIS A durometer of 30 and a thickness of 200 $\mu$m was used as the spacer in this example. Both sides of this silicone rubber sheet were coated to an average thickness of 50 $\mu$m with a silicone-modified epoxy hot-melt adhesive (THMX-501 from the Dow Corning Toray Silicone Company, Limited, JIS A durometer of its cured epoxy product >98) that had a softening point of 60° C. and that cured by epoxide ring-opening polymerization upon heating. This hot-melt adhesive was applied by preliminarily softening it by heating at 70° C. and spreading it out flat in this state using a squeegee.

An essentially flat hot-melt adhesive sheet with a thickness of 300 μm was then obtained by standing at room temperature. As in Example 1, the outflow of the hot-melt adhesive sheet during heat softening and the semiconductor device reliability were evaluated. The results are reported in Table 1.

TABLE 1

| Item ↓ | type of example → | | | | | | |
| --- | --- | --- | --- | --- | --- | --- | --- |
| | present invention | | | | | comparative examples | |
| | Example 1 | Example 2 | Example 3 | Example 4 | Example 5 | Comp. Example 1 | Comp. Example 2 |
| outflow of the hot-melt adhesive sheet (mm) | 0.4 | — | 0.8 | 1.2 | 0.7 | 2.6 | — |
| semiconductor device reliability (% defect rate) | | | | | | | |
| evaluation method 1 | | | | | | | |
| 100 cycles | 0 | — | 0 | 0 | 0 | 5 | — |
| 500 cycles | 0 | — | 0 | 0 | 0 | 15 | — |
| evaluation method 2 | | | | | | | |
| 100 cycles | 0 | — | 0 | 0 | 0 | 10 | — |
| 500 cycles | 0 | — | 5 | 10 | 0 | 30 | — |
| evaluation method 3 | | | | | | | |
| 100 cycles | — | 0 | — | — | — | — | 15 |
| 500 cycles | — | 0 | — | — | — | — | 60 |

Hot-melt adhesive sheet according to the present invention is characterized by highly precise bonding and by the manifestation of a stress-relaxation capacity. Semiconductor devices according to the present invention, because the semiconductor element therein is bonded to its attachment site by the hot-melt adhesive sheet according to the present invention, are characterized by an excellent reliability.

That which is claimed is:

1. A hot-melt adhesive sheet comprising a spacer having the form of a sheet and a hot melt adhesive on both sides of the spacer.

2. The hot-melt adhesive sheet according to claim 1, wherein the spacer has a thickness of at least 10% of the thickness of the hot-melt adhesive sheet.

3. The hot-melt adhesive sheet according to claim 1, wherein the hot-melt adhesive is a silicone adhesive.

4. The hot-melt adhesive sheet according to claim 1, wherein the hot-melt adhesive cures after heat softening.

5. The hot-melt adhesive sheet according to claim 4, wherein the hot-melt adhesive cures by a reaction selected from the group consisting of condensation reactions, dehydrogenation condensation reactions, dehydration condensation reactions, hydrosilation reactions, epoxide ring-opening polymerization reactions, and radical polymerization reactions.

6. The hot-melt adhesive sheet according to claim 1, wherein the spacer is an organic or inorganic material.

7. The hot-melt adhesive sheet according to claim 6, wherein the spacer is an organic material selected from the group consisting of butyl rubber, EPDM rubber, silicone rubber, and fluororubber.

8. The hot-melt adhesive sheet according to claim 7, wherein the organic material is silicon e rubber.

9. The hot-melt adhesive according to claim 6, wherein the spacer is an inorganic material selected from the group consisting of silica and glass.

10. A hot-melt adhesive sheet comprising a mixture of a hot melt adhesive and a spacer, wherein the adhesive is selected from a silicone-modified epoxy resin adhesive, a silicone adhesive, and a silicone-modifies polyimide adhesive, and the spacer has the form particles.

11. The hot-melt adhesive sheet according to claim 10, wherein the spacer has a thickness of at least 10% of the thickness of the hot-melt adhesive sheet.

12. The hot-melt adhesive sheet according to claim 10, wherein the hot-melt adhesive is a silicone adhesive.

13. The hot-melt adhesive sheet according to claim 10, wherein the hot-melt adhesive cures after heat softening.

14. The hot-melt adhesive sheet according to claim 13, wherein the hot-melt adhesive cures by a reaction selected from the group consisting of condensation reactions, dehydrogenation condensation reactions, dehydration condensation reactions, hydrosilation reactions, epoxide ring-opening polymerization reactions, and radical polymerization reactions.

15. The hot-melt adhesive sheet according to claim 10, wherein the spacer is an organic or inorganic material.

16. The hot-melt adhesive sheet according to claim 15, wherein the spacer is an organic material selected from the group consisting of butyl rubber, EPDM rubber, silicone rubber, and fluororubber.

17. The hot-melt adhesive sheet according to claim 16, wherein the organic material is silicone rubber.

18. The hot-melt adhesive according to claim 15, wherein the spacer is an inorganic material selected from the group consisting of silica and glass.

19. The hot-melt adhesive of claim 10, wherein the spacer comprises spherical particles and no more than one weight percent of the particles have a ratio of particle diameter to average particle diameter of at least 3.

* * * * *